United States Patent
Gris et al.

(10) Patent No.: US 6,372,570 B1
(45) Date of Patent: Apr. 16, 2002

(54) METHOD OF FORMATION OF A CAPACITOR ON AN INTEGRATED CIRCUIT

(75) Inventors: Yvon Gris, Tullins; Germaine Troillard, Le Touvet; Jocelyne Mourier, Saint Egreve; Jos Guelen, Crolles; Geneviève Lunardi, Meylan; Henri Banvillet, Froges; Jean-Claude Oberlin, Le Touvet; Catherine Maddalon, Saint Egreve, all of (FR)

(73) Assignees: STMicroelectronics S. A., Gentilly (FR); Koninkluke Philips Electronics N.V., Baeindhoven (NL)

(*) Notice: Subject to any disclaimer, the term of this patent is extended or adjusted under 35 U.S.C. 154(b) by 0 days.

(21) Appl. No.: 09/354,635

(22) Filed: Jul. 16, 1999

(30) Foreign Application Priority Data

Jul. 21, 1998 (FR) .......................................... 98/09437

(51) Int. Cl.⁷ .......................................... H01L 21/8242
(52) U.S. Cl. ........................ 438/239; 438/240; 438/250; 438/393
(58) Field of Search ................................ 438/239, 254, 438/329, 643, 675, 645, 240, 250, 393

(56) References Cited

U.S. PATENT DOCUMENTS 5,563,762 A * 10/1996 Leung et al. ............... 438/239
5,789,303 A    8/1998 Leung et al. ............... 438/381
6,100,195 A *  8/2000 Chan et al. ................. 438/687
6,242,315 B1 * 6/2001 Lin et al. .................... 438/393

FOREIGN PATENT DOCUMENTS

WO    WO 98/05071    2/1998    ........... H01L/27/11

OTHER PUBLICATIONS

French Search Report from French Patent Application No. 98 09437, filed Jul. 21, 1998.
Patent Abstracts of Japan, vol. 018, No. 171 (E–1529), Mar. 23, 1994 & JP-A-05 343613 (Yamaha Corp.).

* cited by examiner

Primary Examiner—Charles Bowers
Assistant Examiner—Yennhu B. Huynh
(74) Attorney, Agent, or Firm—Wolf, Greenfield & Sacks, P.C.; James H. Morris; Theodore E. Galanthay

(57) ABSTRACT

A method of manufacturing a capacitor includes the steps of depositing a first metal level and etching it to leave in place a region corresponding to a first plate of a capacitor and an area of contact with an upper level; depositing an insulating layer; forming a first opening above the first capacitor plate; depositing a thin insulating layer; forming a second opening above the contact area; depositing a second metal level; removing by physico-chemical etching the second metal layer outside regions where it fills up the openings; and depositing a third metal level and leaving in place portions thereof.

16 Claims, 1 Drawing Sheet

METHOD OF FORMATION OF A CAPACITOR ON AN INTEGRATED CIRCUIT

BACKGROUND OF THE INVENTION

1. Field of the Invention

Figure 1:
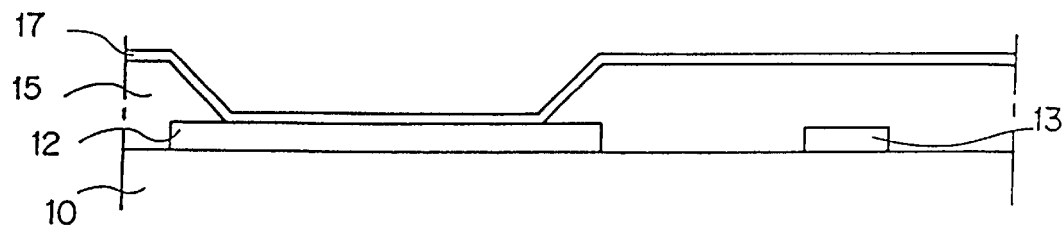

The present invention relates to the field of integrated circuit manufacturing, and more specifically, to the manufacturing of capacitors adapted to operating at high frequency (above one gigahertz), that is, having a small access resistance and a small stray capacitance with substrate elements.

2. Discussion of the Related Art

An integrated circuit includes several layers and regions of different doping levels formed in a semiconductor substrate, currently silicon. Generally, especially in MOS-type technologies, one, or sometimes several, polysilicon level(s) is (are) provided, to form, in particular, the gate(s) of MOS transistors or of memory points. Several metallization levels are provided to ensure the interconnections.

Each formation of a conductive layer, be it doped polysilicon or metal, is followed by the deposition of at least one insulating layer so that, at-the locations where this is desired, the next conductive layer can be insulated from the underlying layer.

Thus, it is possible to form a capacitor each time there are two successively deposited conductive layers separated by an insulating layer.

To form capacitors capable of operating at high frequency, with a small access resistance and a small stray capacitance with elements of the semiconductor component, the use of capacitors having one plate formed of a semiconductive region, as well as the use of capacitors having one plate made of polysilicon has to be avoided. Indeed, both cases provide relatively high access resistances and a relatively/ strong capacitive coupling with elements of the semiconductor substrate. Capacitors between metallizations which are more distant from the substrate and for which the access resistance is small thus have to be used, since metallizations generally conduct better than doped single-crystal silicon or polysilicon.

However, practically all known capacitors between metallization levels have various drawbacks. Often, the second metal is etched while a thin insulator layer has been deposited. As a result, upon etching of the metal, the thin insulator can be damaged, which risks embrittling it and causing punctures. In many solutions, several masking and etching steps have to be provided in addition to those existing in a conventional method. There also are problems of reliability at the level of the capacitor sides. Further, in the case where aluminum is used for one of the metals, there appear problems due to the point punch-through of the aluminum into the neighboring layers.

SUMMARY OF THE INVENTION

Thus, an object of the present invention is to provide a method of manufacturing a capacitor between metallization levels which avoids one or several of the above-mentioned disadvantages.

A more specific object of the present invention is to provide such a method which is compatible with conventional lines of CMOS component manufacturing.

Another object of the present invention is to provide such a method which, practically, does not add any step to the normal steps of CMOS-type component manufacturing.

To achieve these and other objects, the present invention provides a method of manufacturing a capacitor including the steps of depositing a first metal level and etching this first metal level to leave in place at least one region corresponding to a first plate of a capacitor and at least one contact area corresponding to a connection with which an upper contact is desired to be established; depositing an insulating layer between metallization levels; forming a first opening above the first capacitor plate; depositing a thin insulating layer; forming a second opening above the contact area; depositing a second metal level to completely fill up the second opening; performing a physico-chemical etching to remove the second metal layer outside regions where it fills up the openings; depositing a third metal level and leaving in place portions of this third metal level above the capacitor region and the contact region.

According to an embodiment of the present invention, the first and second metal levels are in tungsten.

According to an embodiment of the present invention, the first opening is made to have slanted sides while the second opening is made to have steep sides.

The foregoing objects, features and advantages of the present invention, will be discussed in detail in the following non-limiting description of specific embodiments in connection with FIGS. 1 to 4 which illustrate successive steps of manufacturing of a component according to the present invention.

DETAILED DESCRIPTION

An example of implementation of the manufacturing method according to the present invention will be described hereafter in the context of a CMOS component manufacturing technological line used by STMicroelectronics and designated under denomination HCMOS6. This line provides one polysilicon level and five metallization levels among which the first metallization level is a tungsten layer and the next metallization levels are aluminum layers. At the locations where contacts between metallization levels are desired to be established, vias are dug and filled with tungsten. The chemical vapor-phase tungsten deposition from $WF_6$ is conventionally preceded by the deposition of a titanium layer (40 nm) and of a titanium nitride nucleation layer (100 nm).

As shown in FIG. 1, a semiconductive wafer under manufacturing is considered, the upper surface of which is coated with an insulating layer 10, which is an insulating layer deposited after one or several conductive levels have been formed, for example, the first insulating layer deposited after the last polysilicon level, or an insulating layer of upper level.

Above this insulating layer is formed a metallization layer etched in selected locations, to leave in place, for example, an extended region 12 meant to form the first plate of a capacitor and a narrow region 13 with which a contact is desired to be established by means of a via. After etching, the metallization level including regions 12 and 13 is coated with an insulating layer 15 meant to be used as an insulator between metallization levels, which is a relatively thick layer (a few hundreds of nanometers) and has a relatively small dielectric constant.

According to the present invention, layer 15 is first etched only above regions where capacitors are desired to be formed. A thin insulating layer 17 is then deposited, which corresponds to the dielectric of the capacitor and which thus has to be as thin as possible while keeping a constant thickness and having no cracks to avoid any capacitor puncture and a destruction of the component. The material of layer 17 preferably has a high dielectric constant.

Preferably, to facilitate the deposition of insulating layer 17 and improve its reliability, the opening in insulating layer 15 above electrode plate 12 is formed to have slanted walls. This can for example be obtained by RIE under plasma in the presence of $NF_3$. Several methods may be used to improve this slanted aspect of the opening walls. Successive masks may for example be used. Any known method to perform this slanted side etching of insulating layer 15 may be used.

Figure 2:
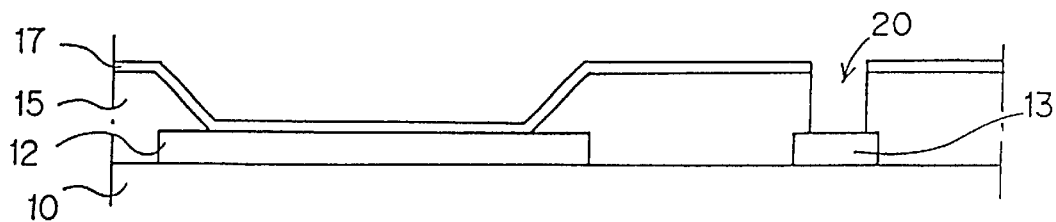

At the step illustrated in FIG. 2, starting from the structure illustrated in FIG. 1, a narrow opening 20 is etched above region 13 with which a contact to the upper level metallization is desired to be established. This opening has to be a steep side opening to reduce or minimize the occupied surface. This can for example be obtained by RIE under plasma in the presence of $CHF_3$ or $SF_6$.

Figure 3:
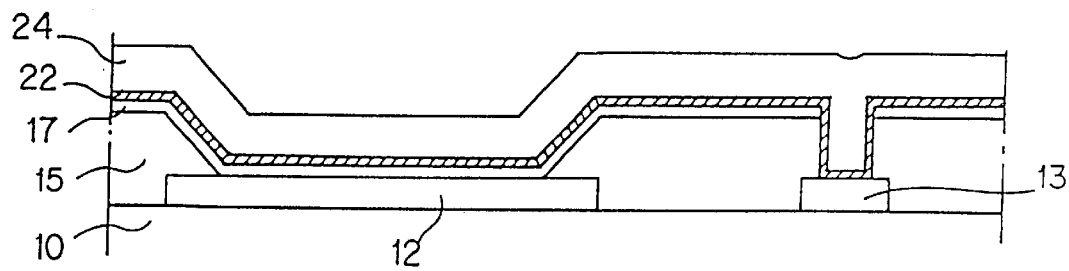

At the step illustrated in FIG. 3, a bonding layer 22 has been deposited, conventionally by successive deposition of Ti and TiN, after which a tungsten layer 24 sufficiently thick to completely fill up opening 20 has been deposited. It should be noted that the steps performed in relation with FIG. 3 are the conventional steps of via filling in a conventional technological line such as line HCMOS6. These via filling steps are used to simultaneously form a tungsten region above the capacitor area.

Figure 4:
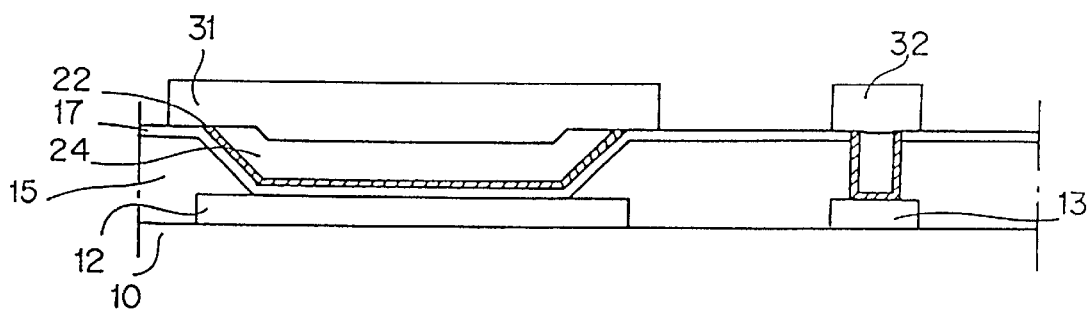

Then, a chem-mech polishing step, not shown, is performed to remove the portion of tungsten layer 24 which is above the level of insulating layers 15 and 17. The portion of bonding layer 22 located under the removed tungsten layer portion may also be removed. Finally, a next metallization level is deposited. This metallization level results for example from the successive deposition of a thin titanium layer and of an aluminum-copper layer. After this, regions 31 and 32 are defined. Region 31 corresponds, with the remaining region of layer 24, to the second capacitor electrode above first electrode 12. Region 32 establishes a contact with the via formed in opening 20. The structure illustrated in FIG. 4 is thus obtained.

To give practical orders of magnitude, the width of opening 20 of a via between two metallization levels is for example on the order of 0.4 $\mu$m. Conversely, the lateral dimensions of the opening corresponding to the capacitor are much larger, for example on the order of 400 to 800 $\mu$m. It should be noted that the drawing is not to scale and that the capacitor region has a much wider extension than shown with respect to the vias.

The manufacturing method of the present invention has many advantages.

According to a first advantage, it implies very few additional steps with respect to a conventional method of CMOS component manufacturing in which no capacitor is provided. The only additional steps are the opening of layer 15 above the capacitor regions and the deposition of insulating layer 17. All the other masking and deposition steps are used conventionally. Incidentally, it should be noted that the presence of oxide layer 17 has an additional advantage in that it marks the end of the chem-mech etch performed between the steps of FIGS. 3 and 4. Thus, not only does the method enable making capacitors, but it also further improves the conventional method of via formation.

A second advantage of the present invention is the fact that the sides of the capacitor openings, in which the thin insulating layer intended to form the capacitor dielectric is deposited, are slanted, whereby the lower angles of this layer are unlikely to exhibit defects.

Another advantage of the present invention appears in the case of line HCMOS6 used by STMicroelectronics in which the first metallization layer forming region 12 is a tungsten layer and in which the vias are filled with tungsten. Given that regions 12 and 24 are both made of tungsten, when the component temperature varies, there is no differential expansion stress on either side of insulating layer 17, which would occur if the layers on either side were made of different metals.

Another advantage of the use of tungsten is that this material can withstand high temperatures, up to 700° C. Insulating layer 17 can thus be deposited at a temperature on the order of 700° C. However, if the lower layer was an aluminum layer, a temperature on the order of 400° C. could no be exceeded. Now, in practice, it is known that the quality of a thin insulating layer improves when its deposition is performed at a higher temperature.

A reliable component has thus been obtained, with a small stray capacitance with the substrate elements, and with a small access resistance, given that tungsten is a material having a relatively high conductivity.

Of course, the present invention is likely to have various alterations, modifications, and improvements which will readily occur to those skilled in the art, as concerns the choice of materials and the practical implementation of specific steps. For example, insulating layer 17 can be made of silicon oxide, of silicon nitride, or of another chosen insulator, or else of a combination of insulators.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a capacitor including the steps of:

depositing a first metal level and etching this first metal level to leave in place at least one region corresponding to a first plate of a capacitor and at least one contact area corresponding to a connection with which an upper contact is desired to be established;

depositing an insulating layer between metallization levels;

forming a first opening above the first capacitor plate;

depositing a thin insulating layer corresponding to the capacitor dielectric;

forming a second opening above the contact area;

depositing a second metal level to completely fill up the second opening;

performing a physico-chemical etching to suppress the second metal layer outside regions where it fills up the openings; with the remaining portion of the second metal layer above the first opening corresponding to the second capacitor plate; and depositing a third metal level and leaving in place portions of this third metal level above the capacitor region and the contact region.

2. The method of claim 1, wherein the first and second metal levels are in tungsten.

3. The method of claim 2, wherein the third metal level is made of Al—Cu.

4. The method of claim 1 wherein the first opening is made to have slanted sides while the second opening is made to have steep sides.

5. The method of claim 1, wherein the first metal level comprises tungsten.

6. The method of claim 1, wherein the second metal level comprises tungsten.

7. The method of claim 1, wherein the first and second metal levels are in tungsten and the third metal level comprises Al—Cu.

8. The method of claim 7, wherein the first opening is made to have slanted sides.

9. The method of claim 7, wherein the second opening is made to have steep sides.

10. The method of claim 1, wherein the first opening is made to have slanted sides.

11. The method of claim 1, wherein the second opening is made to have steep sides.

12. The method of claim 1, wherein the step of depositing a third metal level includes leaving separately spaced metal regions, respectively, above capacitor region and above the contact region.

13. The method of claim 1, wherein the step of forming a first opening includes forming slanted walls defining the first opening.

14. The method of claim 1, wherein the step of forming a second opening includes forming steep side walls defining the second opening.

15. The method, of claim 1 further including, after the step of forming a second opening, depositing a bonding layer before depositing the second metal level.

16. A method of manufacturing a capacitor including the steps of:

depositing a first metal level and etching this first metal level to leave in place at least one region corresponding to a first plate of the capacitor and at least one contact area corresponding to a connection with which an upper contact is desired to be established;

depositing an insulating layer between metallization levels;

forming a first opening above the first capacitor plate;

depositing a thin insulating layer corresponding to the capacitor dielectric;

forming a second opening above the contact area;

depositing a second metal level to extend into said first and second openings and define a second metal layer region above the first opening and corresponding to the second capacitor plate; and depositing a third metal level and leaving in place portions of this third metal level above the capacitor region and the contact region.

* * * * *

UNITED STATES PATENT AND TRADEMARK OFFICE
CERTIFICATE OF CORRECTION

| | | |
|---|---|---|
| PATENT NO. | : 6,372,570 B1 | |
| DATED | : April 16, 2002 | |
| INVENTOR(S) | : Yvon Gris, Germaine Troillard, Jocelyne Mourier, Jos Guelen, Geneviéve Lunardi, Henri Banvillet, Jean-Claude Oberlin and Catherine Baddalon | |

It is certified that error appears in the above-identified patent and that said Letters Patent is hereby corrected as shown below:

<u>Title page,</u>
Item [73], should read:
-- [73] Assignee: STMicroelectronics S.A., Gentilly, (FR);
Koninklijke Philips Electronics N.V., Ba Eindhoven (NL) --

Signed and Sealed this

Twelfth Day of November, 2002

JAMES E. ROGAN
*Director of the United States Patent and Trademark Office*

*Attest:*

*Attesting Officer*